United States Patent
Kuwano

(10) Patent No.: US 12,183,600 B2
(45) Date of Patent: Dec. 31, 2024

(54) METHOD OF DETERMINATION OF PRETREATMENT CONDITIONS OF HEAT TREATMENT FURNACE, METHOD OF PRETREATMENT OF HEAT TREATMENT FURNACE, HEAT TREATMENT DEVICE, AND MANUFACTURING METHOD AND MANUFACTURING DEVICE OF HEAT-TREATED SEMICONDUCTOR WAFER

(71) Applicant: SUMCO CORPORATION, Tokyo (JP)

(72) Inventor: Yoshihiro Kuwano, Saga (JP)

(73) Assignee: SUMCO CORPORATION, Tokyo (JP)

( * ) Notice: Subject to any disclaimer, the term of this patent is extended or adjusted under 35 U.S.C. 154(b) by 826 days.

(21) Appl. No.: 17/418,534

(22) PCT Filed: Dec. 6, 2019

(86) PCT No.: PCT/JP2019/047783
§ 371 (c)(1),
(2) Date: Jun. 25, 2021

(87) PCT Pub. No.: WO2020/137441
PCT Pub. Date: Jul. 2, 2020

(65) Prior Publication Data
US 2022/0122855 A1 Apr. 21, 2022

(30) Foreign Application Priority Data

Dec. 27, 2018 (JP) .................................. 2018-245445

(51) Int. Cl.
*H01L 21/67* (2006.01)
*H01L 21/324* (2006.01)

(52) U.S. Cl.
CPC ...... *H01L 21/67103* (2013.01); *H01L 21/324* (2013.01)

(58) Field of Classification Search
None
See application file for complete search history.

(56) References Cited

U.S. PATENT DOCUMENTS

| 10,347,512 | B2 | 7/2019 | Tanimura et al. |
| 2003/0089426 | A1* | 5/2003 | Poor ..................... C21D 1/773 |
| | | | 148/216 |
| 2007/0180955 | A1* | 8/2007 | Warner ................. C21C 5/562 |
| | | | 75/406 |

FOREIGN PATENT DOCUMENTS

| CN | 101540275 A | 9/2009 |
| CN | 102460650 | 5/2012 |

(Continued)

OTHER PUBLICATIONS

International Preliminary Report on Patentability for PCT/JP2019/047783, which was mailed on Jun. 16, 2021, together with an English translation.

(Continued)

*Primary Examiner* — Mohammad Ali
*Assistant Examiner* — Saad M Kabir
(74) *Attorney, Agent, or Firm* — GREENBLUM & BERNSTEIN, P.L.C.

(57) ABSTRACT

Provided is a method of determination of pretreatment conditions of a heat treatment furnace, wherein the pretreatment is heating a furnace interior of the heat treatment furnace while supplying a gas thereinto, the method including setting a plurality of candidates of a combination of a type of a supply gas and a heating temperature; assigning to each candidate of the combination a score determined according to a type of a target metal identified as an object to be removed in the pretreatment; and determining, from the plurality of candidates, the combination of the type of the (Continued)

supply gas and the heating temperature to be adopted as the pretreatment conditions, with the assigned score serving as an indicator.

11 Claims, 7 Drawing Sheets

(56) References Cited

FOREIGN PATENT DOCUMENTS

| | | |
|---|---|---|
| CN | 106340451 A | 1/2017 |
| JP | 2002-025924 | 1/2002 |
| JP | 2002-252179 A | 9/2002 |
| JP | 2003-224122 | 8/2003 |
| JP | 2004-146486 | 5/2004 |
| JP | 2009-130079 | 6/2009 |
| TW | 201135845 | 10/2011 |

OTHER PUBLICATIONS

Office Action dated Apr. 14, 2023 issued in related Korean patent application No. 10-2021-7022882, along with an English translation thereof.
Office Action issued in Taiwan Counterpart Patent Appl. No. 108143127, dated Jan. 26, 2021, along with an English translation thereof.
Official Communication issued in International Bureau of WIPO Patent Application No. PCT/JP2019/047783, dated Mar. 10, 2020, along with an English translation thereof.
Official Communication issued in International Bureau of WIPO Patent Application No. PCT/JP2019/047783, dated Mar. 10, 2020.
Japanese Office Action issued in Japanese Patent Application No. 2020-563018, dated Jul. 5, 2022, along with an English translation thereof.
Office Action dated Sep. 23, 2023 issued in related Chinese patent application No. 201980086161.8, along with an English translation thereof.

* cited by examiner

METHOD OF DETERMINATION OF PRETREATMENT CONDITIONS OF HEAT TREATMENT FURNACE, METHOD OF PRETREATMENT OF HEAT TREATMENT FURNACE, HEAT TREATMENT DEVICE, AND MANUFACTURING METHOD AND MANUFACTURING DEVICE OF HEAT-TREATED SEMICONDUCTOR WAFER

CROSS-REFERENCE TO RELATED APPLICATIONS

This application claims the benefit of priority to Japanese Patent Application No. 2018-245445 filed on Dec. 27, 2018, which is expressly incorporated herein by reference in its entirety.

TECHNICAL FIELD

The present invention relates to a method of determination of pretreatment conditions of a heat treatment furnace, a method of pretreatment of a heat treatment furnace, a heat treatment device, and a manufacturing method and a manufacturing device of a heat-treated semiconductor wafer.

BACKGROUND ART

A heat treatment furnace is widely used for arranging an object to be heated in a furnace, and performing various heat treatments thereon. Such a heat treatment furnace can be exemplified by, for example, an annealing furnace for annealing a semiconductor wafer, and an epitaxial growth furnace for forming an epitaxial layer on a semiconductor wafer.

When a pollutant metal is present in a heat treatment furnace, the metal is deposited on an object to be heated during a heat treatment, whereby metal contamination is caused in the object to be heated. Thus, in order to remove the pollutant metal in the heat treatment furnace, as a pretreatment before performing a heat treatment on the object to be heated, heating of the furnace interior of the heat treatment furnace is performed while supplying a gas thereinto (so-called empty heating) (see Japanese Patent Application Publication No. 2002-25924 and Japanese Patent Application Publication No. 2003-224122, which are expressly incorporated herein by reference in their entirety).

SUMMARY OF INVENTION

Japanese Patent Application Publication No. 2002-25924 and Japanese Patent Application Publication No. 2003-224122 propose subjecting the heat treatment furnace to a pretreatment (empty heating) under specific conditions (see the claims of the above publications). However, conventionally, there has been no way but to repeat numerous trial and error in order to determine such pretreatment conditions.

One aspect of the present invention provides a method for efficiently determining the pretreatment conditions of a heat treatment furnace.

One aspect of the present invention relates to:
a method of determination of pretreatment conditions of a heat treatment furnace (which will be also referred to as simply "determination method"),
wherein the pretreatment is heating a furnace interior of the heat treatment furnace while supplying a gas thereinto,
the method including:
setting a plurality of candidates of a combination of a type of a supply gas and a heating temperature;
assigning to each candidate of the combination a score determined according to a type of a target metal identified as an object to be removed in the pretreatment; and
determining, from the plurality of candidates, the combination of the type of the supply gas and the heating temperature to be adopted as the pretreatment conditions, with the assigned score serving as an indicator.

In accordance with the above determination method, the pretreatment conditions can be determined efficiently, without repeating numerous trial and error, on the basis of the score determined according to the type of the metal identified as the object to be removed for each candidate of the combination of the type of the supply gas and the heating temperature.

In one embodiment, the score can be a score determined by thermodynamics equilibrium calculation based on the type of the target metal.

In one embodiment, the thermodynamics equilibrium calculation can be multicomponent thermodynamics equilibrium calculation including an element of the target metal and an element included in the supply gas of the candidate.

In one embodiment, by the thermodynamics equilibrium calculation,
an equilibrium volatilization gas partial pressure of the gas including the target metal,
a total sum of the equilibrium substance amounts of the target metal in a solid compound including the target metal,
a free energy $\Delta G^0$ of Gibbs of a volatilization reaction involving the target metal, and
a free energy $\Delta G^0$ of Gibbs of a contamination reaction involving the target metal,
can be determined so that the score can be determined, with the determined results serving as an indicator.

In one embodiment, the score can be a multiplier of,
a score determined with the equilibrium volatilization gas partial pressure of the gas, that includes the target metal, serving as an indicator,
a score determined with the total sum of the equilibrium substance amounts of the target metal in the solid compound, that includes the target metal, serving as an indicator,
a score determined with the free energy $\Delta G^0$ of Gibbs of the volatilization reaction, that involves the target metal, serving as an indicator, and
a score determined with the free energy $\Delta G^0$ of Gibbs of the contamination reaction, that involves the target metal, serving as an indicator.

One aspect of the present invention relates to:
a method of pretreatment of a heat treatment furnace (which will be also referred to as simply "pretreatment method"), the method including:
determining pretreatment conditions of a heat treatment furnace by the above determination method; and
pretreating the heat treatment furnace under the determined pretreatment conditions.

One aspect of the present invention relates to:
a method of manufacturing a heat-treated semiconductor wafer (which will be also referred to as simply "manufacturing method"), the method including:
pretreating a heat treatment furnace by the above pretreatment method; and
heat treating a semiconductor wafer in the pretreated heat treatment furnace.

One aspect of the present invention relates to:
a heat treatment device, including:
a heat treatment furnace;
a heat treatment furnace control part; and
a pretreatment conditions determination part which determines pretreatment conditions of pretreating the heat treatment furnace,
wherein the pretreatment is heating a furnace interior of the heat treatment furnace while supplying a gas thereinto,
the pretreatment conditions determination part includes:
a candidate recording part which records a plurality of candidates of a combination of a type of the supply gas and a heating temperature; and
an analysis part having a calculating information recording part, a score calculation part and a combination determination part,
the calculating information recording part records calculating information for calculating a score of the candidate recorded in the candidate recording part,
the calculating information is determined according to a type of a target metal identified as an object to be removed in the pretreatment,
the score calculation part calculates the score of the candidate recorded in the candidate recording part from the calculating information,
the combination determination part determines, from the plurality of candidates, a combination of the type of the supply gas and the heating temperature to be adopted as pretreatment conditions of the heat treatment furnace, with the calculated score serving as an indicator,
the heat treatment furnace control part receives information of the combination of the type of the supply gas and the heating temperature determined by the combination determination part, and transmits pretreatment execution information causing the heat treatment furnace to execute pretreatment according to the received information, and
the heat treatment furnace receives the pretreatment execution information, and executes pretreatment according to the pretreatment execution information.

In one embodiment, the calculating information can be determined by thermodynamics equilibrium calculation on the basis of the type of the target metal.

In one embodiment, the thermodynamics equilibrium calculation can be multicomponent thermodynamics equilibrium calculation including an element of the target metal, and an element included in the supply gas of the candidate.

In one embodiment, the calculating information can include the following information determined by the thermodynamics equilibrium calculation:
an equilibrium volatilization gas partial pressure of the gas including the target metal;
a total sum of equilibrium substance amounts of the target metal in a solid compound including the target metal;
a free energy $\Delta G^0$ of Gibbs of a volatilization reaction involving the target metal; and
a free energy $\Delta G^0$ of Gibbs of a contamination reaction involving the target metal.

In one embodiment, the score can be a multiplier of,
a score determined with the equilibrium volatilization gas partial pressure of the gas, that includes the target metal, serving as an indicator,
a score determined with the total sum of the equilibrium substance amounts of the target metal in the solid compound, that includes the target metal, serving as an indicator,
a score determined with the free energy $\Delta G^0$ of Gibbs of the volatilization reaction, that involves the target metal, serving as an indicator, and
a score determined with the free energy $\Delta G^0$ of Gibbs of the contamination reaction, that involves the target metal, serving as an indicator.

In one embodiment, the above heat treatment device can further include a correction part which provides correction information to one or more of the calculating information recording part, the score calculation part, and the combination determination part.

One aspect of the present invention relates to a manufacturing device of a heat-treated semiconductor wafer, the manufacturing device including the above heat treatment device.

In accordance with one aspect of the present invention, based on the score determined according to the type of the target metal identified as the object to be removed for every candidate of the combination of the type of the supply gas and the heating temperature, the pretreatment conditions can be efficiently determined without repeating numerous trial and error. Further, another aspect of the present invention can provide a method of pretreatment of a heat treatment furnace including pretreating a heat treatment furnace under the pretreatment conditions thus determined, and a method of manufacturing a heat-treated semiconductor wafer including heat treating a semiconductor wafer in the heat treatment furnace subjected to such a pretreatment. Still further, a still other aspect of the present invention can provide a heat treatment device, and can also provide a manufacturing device of a heat-treated semiconductor wafer including the above heat treatment device.

DESCRIPTION OF EMBODIMENTS

Figure 1:
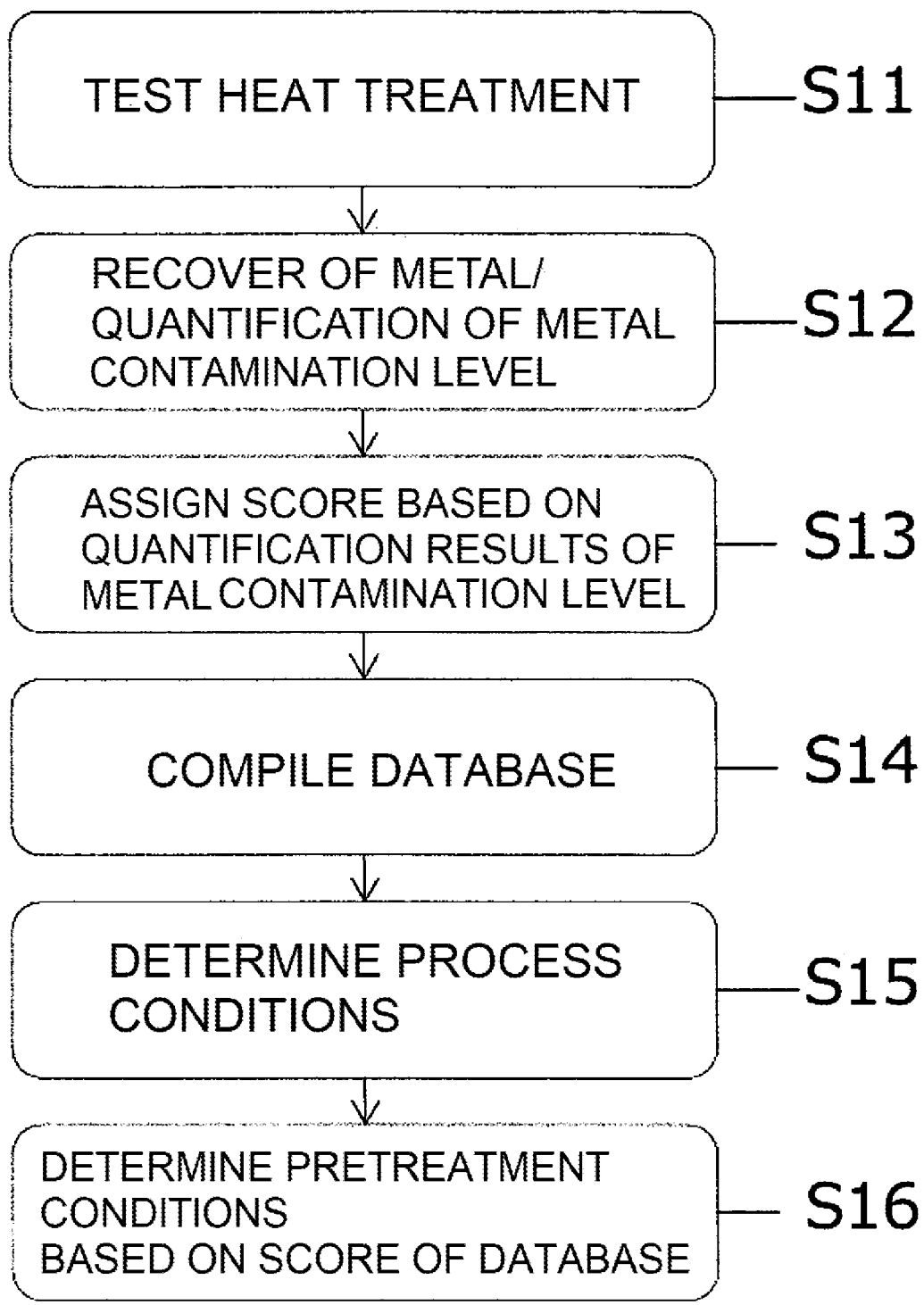
FIG. 1 is a flowchart showing one example of a determination method in accordance with one aspect of the present invention.

In some descriptions below, one aspect of the present invention is described with reference to the drawings. However, the present invention is not limited to the examples shown in the drawings.

[Method of Determination of Pretreatment Conditions of Heat Treatment Furnace]

One aspect of the present invention relates to a method of determination of pretreatment conditions of a heat treatment furnace: the pretreatment being heating the furnace interior of the heat treatment furnace while supplying a gas thereinto, the method including: setting a plurality of candidates of a combination of a type of a supply gas and a heating temperature; assigning a score determined according to a type of a target metal identified as an object to be removed by the heat treatment to each candidate of the combination; and determining the combination of the type of the supply gas and the heating temperature to be adopted as the pretreatment conditions from the plurality of candidates with the assigned score as an indicator.

Figure 2:
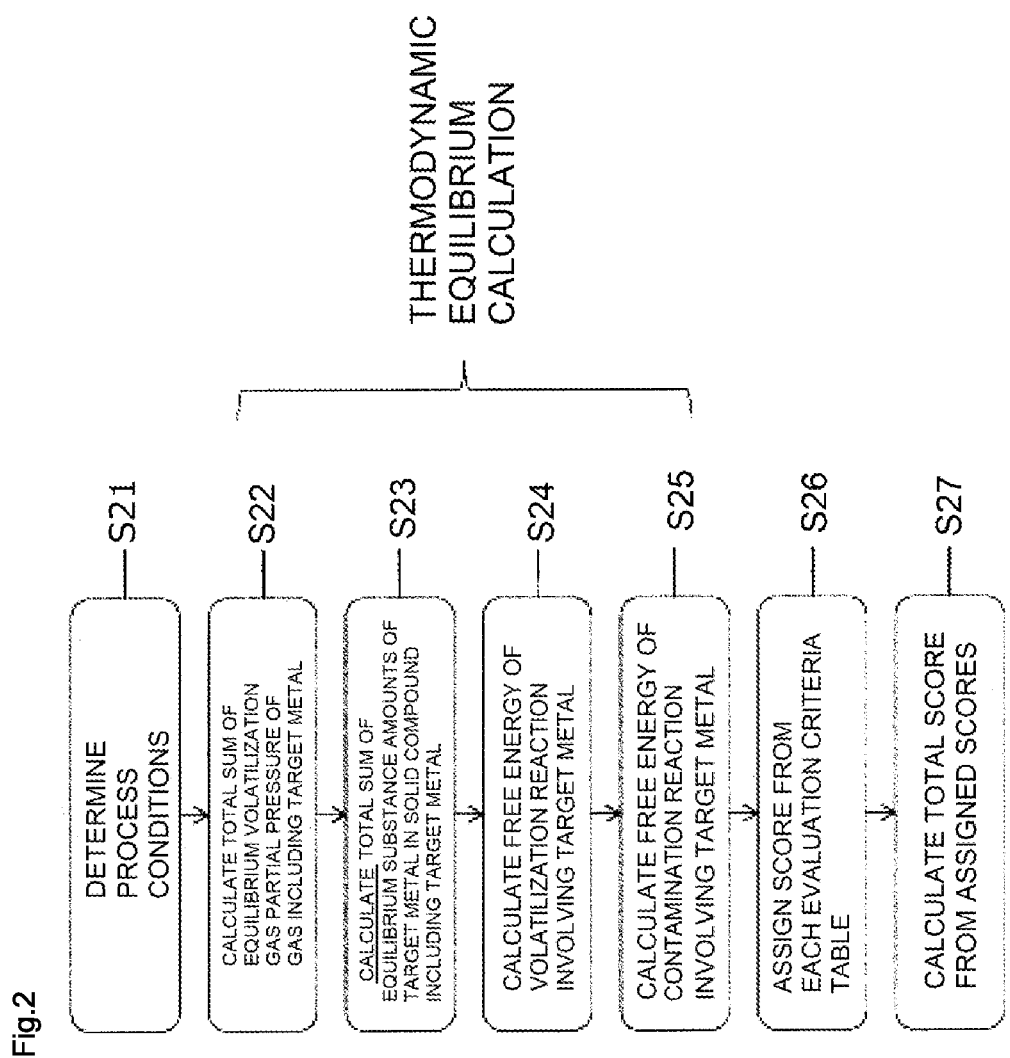
FIG. 2 is a flowchart showing another example of the method of determination in accordance with one aspect of the present invention.

FIG. 1 is a flowchart showing one example of the method of determination in accordance with one aspect of the present invention. FIG. 2 is a flowchart showing another example of the method of determination in accordance with one aspect of the present invention. Below, the above determination method will be further described in details appropriately with reference to FIGS. 1 and 2.

<Heat Treatment Furnace>

The heat treatment furnace for which the pretreatment conditions are determined by the above determination method can be a heat treatment furnace with a known configuration usable for various heat treatments. Specific examples thereof can include an annealing furnace for annealing a semiconductor wafer, an epitaxial growth furnace for forming an epitaxial layer on a semiconductor wafer, and a heat treatment furnace for thermally oxidizing a semiconductor wafer. However, any heat treatment furnace is acceptable so long as it can perform a heat treatment by arranging a object to be heated in the furnace, and the present invention is not limited to the above specific examples. The heat treatment furnace includes at least a heating means, and can also include a gas supplying means for supplying a gas such as a reactive gas or an inert gas into a furnace, a gas discharging means for discharging the gas in the furnace, and the like.

<Pretreatment of Heat Treatment Furnace>

A pretreatment is performed before actually carrying out a heat treatment of the object to be heated in a heat treatment furnace. The pretreatment denotes heating of the furnace interior of the heat treatment furnace while supplying a gas thereinto with the object to be heated not arranged therein. Examples of the gases to be supplied into the furnace for the pretreatment can include one from among an inorganic gas such as an oxygen gas, a nitrogen gas, an argon gas, a hydrogen gas and the like, and an organic gas. Examples thereof also include a mixed gas of two or more of the above gasses. Examples of the organic gas can include an organic halogen compound gas such as an organic chlorine compound gas. Further, the heating temperature in the furnace during the pretreatment can be, for example, 700° C. to 1300° C. Herein, the heating temperature in the furnace can be at least one temperature selected from the group consisting of the set temperature of the heating means of the heat treatment furnace, the atmosphere temperature in the furnace, the surface temperature of the inner wall of the heat treatment furnace, and the surface temperature of any one or more members arranged in the furnace.

The removal efficiency of the pollutant metal by the pretreatment may vary according to the type of the pollutant metal to be removed even when the pretreatment is performed under the same pretreatment conditions. For this reason, conventionally, in order to determine the pretreatment conditions capable of efficiently reducing the metal to be removed from the inside of the heat treatment furnace by the pretreatment, trial and error have been normally repeated without any indicator. In contrast, with the above determination method, first, a plurality of candidates of the combination of "the type of the supply gas" and "the heating temperature" are set. Then, a score is assigned to each of the plurality of candidates according to the type of the target metal identified as an object to be removed. The score can be determined, for example, so that the higher the score is assigned, the higher the removal efficiency of the target metal is estimated to be. The determination of the score can be performed experimentally in one embodiment, and can be performed by calculation in another embodiment. The specific embodiment of assignment of the score will be described later. With the above determination method, with the score thus assigned to each candidate as an indicator, the combination of the type of the supply gas and the heating temperature adopted as the pretreatment conditions is determined from a plurality of candidates. By determining the pretreatment conditions with the score thus determined experimentally or by calculation as an indicator, it becomes possible to determine the pretreatment conditions of the heat treatment furnace without repeating numerous trial and error. The metal to be removed can be determined in consideration of the use after the heat treatment of the object to be heated, which is to be subjected to a heat treatment by the heat treatment furnace targeted for the pretreatment, or the like. For example, when the object to be heated is a semiconductor wafer, the metal contamination which may affect the device characteristics is desired to be reduced. For this reason, one or two or more of various metals (e.g., iron, copper, nickel, chromium, aluminum, sodium and the like) can be identified as the object to be removed.

<Assignment of Score>

As the method for experimentally assigning a score to the candidate of the combination of "the type of the supply gas" and "the heating temperature" for the pretreatment of the heat treatment furnace, for example, the following method can be mentioned. A heat treatment furnace intentionally polluted by a target metal in a known amount is subjected to a test heat treatment (test pretreatment) under the conditions of the combination of the supply gas and the heating temperature of a given candidate (S11 in FIG. 1). A part or the whole of the target metal left in the heat treatment furnace after the test pretreatment is recovered by a known method, and the recovered target metal is quantified (S12 in FIG. 1). For example, the score can be determined so that the higher the score is assigned to the candidate, the smaller the amount of the recovered target metal (i.e., the higher the removal efficiency of the target metal) (S13 in FIG. 1). Alternatively, assignment of a score can be performed based on the value obtained in the following manner: a weighting function is determined based on the metal contamination level of the heat-treated product heat treated in the heat treatment furnace after a test pretreatment or a pretreatment has actually been performed; and the value experimentally obtained by the weighting function is subjected to a weighting treatment. Still alternatively, assignment of a score can be performed using simulation, optimization calculation tool and the like.

Further, as the experimentally performed method, the following method can also be mentioned. In the heat treatment furnace after the test pretreatment has been performed as described above, the heat treatment of a sample (e.g., a semiconductor wafer, or a test piece cut from a semiconductor material such as a semiconductor wafer) is performed under given heat treatment conditions. A part or the whole of the target metal deposited on the surface of the sample after the heat treatment and/or the target metal diffused at the surface layer part, and the like of the sample is recovered and quantified by a known method. Quantification can be performed by, for example, ICP-MS (Inductively Coupled Plasma-Mass Spectrometry). Alternatively, by analyzing the sample after the test pretreatment by a known method, the metal contamination level by the target metal is quantified. Examples of the analysis method can include the μ-PCD (Microwave Photoconductivity Decay) method, the SPV (Surface Photovoltage) method or the like. Herein, it can be said that a small amount of the target metal amount quantified for the sample means a small amount of the metal contamination of the sample by the heat treatment in the heat treatment furnace after the test pretreatment. In other words, it can be said that a small amount the target metal amount quantified for the sample means a small amount of the removal efficiency of the target metal by the test pretreatment. Therefore, the score can be determined so that the higher the score is assigned to the candidate, the smaller the target metal amount quantified for the sample (i.e., the higher the removal efficiency of the target metal). Alternatively, assignment of a score can be performed based on the value after performing the weighting treatment as described above, or can be performed using simulation, optimization calculation tool or the like.

The test heat treatment can be performed in a heat treatment furnace actually subjected to the pretreatment, or can be performed, for example, in a heat treatment furnace with a smaller scale than that of the heat treatment furnace actually subjected to the pretreatment.

Thus, a score is assigned to each candidate for every target metal, and, for example, compilation of a data base (e.g., formation of a score table) can be performed (S14 in FIG. 1). If such a data base is compiled, subsequently, when the process conditions for the target metal to be removed or the like are determined (S15 in FIG. 1), for example, the candidate estimated to be high in removal efficiency of the metal (e.g., to have a high score) can be selected from the data base, and can be determined as the pretreatment conditions (the supply gas and the heating temperature) for actually pretreating the heat treatment furnace (S16 in FIG. 1). Thus, it is possible to determine the pretreatment conditions of the heat treatment furnace without repeating numerous trial and error.

On the other hand, examples of the calculation method for performing the assignment of a score by calculation can include thermodynamics equilibrium calculation. Namely, the score can be the score determined by thermodynamics equilibrium calculation based on the type of the target metal in one embodiment. The thermodynamics equilibrium calculation is the method for calculating the equilibrium composition for minimizing the free energy of Gibbs by an optimization means, and the calculation method is known. The calculation can be performed by known calculation software. During the pretreatment, the element of the pollutant metal and the element forming the supply gas are present in the heat treatment furnace. Namely, a plurality of elements are present in the heat treatment furnace during the pretreatment. For this reason, the thermodynamics equilibrium calculation can be a multicomponent thermodynamics equilibrium calculation including the element of the target metal identified as the object to be removed and the element included in the supply gas of the combination of the candidate. Further, with the multicomponent thermodynamics equilibrium calculation, the constituent element of the object to be heated, which is to be actually heat treated in a heat treatment furnace, and the constituent element of the member actually present in a heat treatment furnace during the heat treatment can also be considered in calculation. For example, when the heat treatment of a silicon wafer is performed in a heat treatment furnace after the pretreatment, silicon (Si), the constituent element of the surface coating film (e.g., a $SiO_2$ film) of the wafer support member and the like can also be involved in the volatilization reaction and the contamination (deposition) reaction of the metal to be removed. For this reason, these various elements can also be considered in multicomponent thermodynamics equilibrium calculation. Further, with the multicomponent thermodynamics equilibrium calculation, even when two or more metals are identified as the object to be removed, thermodynamics equilibrium calculation is possible. The pressure in the heat treatment furnace (i.e., the pressure in the system) to be inputted to calculation software for thermodynamics equilibrium calculation can be arbitrarily set, and can be set at, for example, about more than 0 atm and 100 atm or less. Thus, various process conditions are determined (S21 in FIG. 2), so that thermodynamics equilibrium calculation can be performed.

Examples of the reactions, which may be effected in the heat treatment furnace, can include the reaction in which the target metal deposited on the heat treatment furnace volatilizes and the reaction in which the target metal pollutes the heat treatment furnace (i.e., the target metal is deposited on the heat treatment furnace). This is due to the following: even if the target metal volatilizes from the heat treatment furnace, when contamination (deposition) is caused, the efficiency of removing the target metal from the heat treatment furnace is reduced. Therefore, in order to efficiently remove the target metal from the heat treatment furnace, both models of the volatilization model and the contamination model in the heat treatment furnace are preferably considered in thermodynamics equilibrium calculation. More particularly, in order to efficiently remove the target metal from the heat treatment furnace, the pretreatment conditions are preferably set as "the conditions such that for the volatilization model, the amount of the volatile matter of the target metal in the heat treatment furnace is large, and for the contamination model, the amount of the target metal deposited is small". In other words, the conditions can be said to be "the conditions such that the vapor pressure of the gas including the target metal is high, and the volatilization reaction of the gas including the target metal tends to be caused, and the conditions such that the solid pollutant of the target metal is small, and the contamination reaction is less likely to be caused". Under such circumstances, in one embodiment of the above determination method, in order to assign a score, by thermodynamics equilibrium calculation, the equilibrium volatilization gas partial pressure of the gas including the target metal, the total sum of the equilibrium substance amounts of the target metal in the solid compound including the target metal, the free energy $\Delta G^0$ of Gibbs of the volatilization reaction involving the target metal, and the free energy $\Delta G^0$ of Gibbs of the contamination reaction involving the target metal are determined, and the score can be determined with the determined results as an indicator (S22 to S27 in FIG. 2). Specific embodiment in which a score is assigned based on the indicator will be described below.

For the equilibrium volatilization gas partial pressure of the gas including the target metal (i.e., the partial pressure of the volatilization gas in an equilibrium state), it can be said that the larger this value is, the more likely the target metal is to volatilize, and the more likely to be removed from the heat treatment furnace. Therefore, the evaluation criteria can be determined so that the higher the score is assigned, the larger the equilibrium volatilization gas partial pressure of the gas including the target metal calculated by thermodynamics equilibrium calculation is (as one example, the evaluation criteria table as in Table 1 described later is formed), and the score can be determined with the equilibrium volatilization gas partial pressure of the gas, which includes the target metal, serving as an indicator.

For the total sum of the equilibrium substance amounts of the target metal (i.e., the substance amounts in an equilibrium state) in a solid compound including the target metal, it can be said that, the smaller this value is, the less likely the deposition (contamination) of the target metal to the heat treatment furnace is to be caused. Therefore, for example, the evaluation criteria can be determined so that the higher the score is assigned, the smaller the total sum of equilibrium substance amounts of the target metal in a solid compound including the target metal calculated by thermodynamics equilibrium calculation is (as one example, the evaluation criteria table as in Table 3 described later is formed), and the score can be determined with the total sum of the equilibrium substance amounts of the target metal in a solid compound, which includes the target metal, as an indicator.

For the free energy $\Delta G^0$ of Gibbs of the volatilization reaction involving the target metal, it can be said that, the smaller this value is, the more likely the target metal is to volatilize, and the more likely to be removed from the heat treatment furnace. Therefore, the evaluation criteria can be determined so that the higher the score is assigned, the smaller the free energy $\Delta G^0$ of Gibbs of the volatilization reaction involving the target metal calculated by thermodynamics equilibrium calculation is (as one example, the evaluation criteria table as in Table 6 described later is formed), and the score can be determined with the free energy $\Delta G^0$ of Gibbs of the volatilization reaction, which involves the target metal, as an indicator. Further, for the supply gas of a given candidate, when there may be a plurality of volatilization reactions involving the target metal, the $\Delta G^0$ of the volatilization reaction with the minimum free energy $\Delta G^0$ of Gibbs, the maximum $\Delta G^0$ thereof, or the average (e.g., the arithmetic average) of the free energies of Gibbs of the plurality of volatilization reactions can be used as the indicator for determining the score. The minimum $\Delta G^0$ of the volatilization reaction or the maximum $\Delta G^0$ thereof is preferably used as the indicator for determining the score, and the minimum $\Delta G^0$ of the volatilization reaction is more preferably used as the indictor for determining the score.

For the free energy $\Delta G^0$ of Gibbs of the contamination reaction involving the target metal, it can be said that when this value is a positive value, the deposition (contamination) of the target metal to the heat treatment furnace is less likely to be caused as compared with the case where this value is a negative value. Further, it can be said that, the positive value with a larger absolute value of the positive values, and the negative value with a smaller absolute value of the negative values are less likely to cause the deposition (contamination) of the target metal to the heat treatment furnace. Therefore, for example, the evaluation criteria can be determined (as one example, the evaluation criteria table as in Table 9 described later is formed) so that a higher score is assigned when the free energy $\Delta G^0$ of Gibbs of the contamination reaction involving the target metal calculated by thermodynamics equilibrium calculation is a positive value than the case where the free energy $\Delta G^0$ of Gibbs is a negative value, and so that a higher score is assigned when the absolute value of the positive value is larger of the positive values, and so that a higher score is assigned when the absolute value of the negative value is smaller of the negative values. Thus, the score can be determined with the free energy $\Delta G^0$ of Gibbs of the contamination reaction involving the target metal as an indicator. Still further, for the supply gas of a given candidate, when there may be a plurality of contamination reactions involving the target metal, the $\Delta G^0$ of the contamination reaction with the minimum free energy $\Delta G^0$ of Gibbs, the maximum $\Delta G^0$ thereof, or the average (e.g., the arithmetic average) of the free energies of Gibbs of the plurality of contamination reactions can be used as the indicator for determining the score. The minimum $\Delta G^0$ of the contamination reaction or the maximum $\Delta G^0$ thereof is preferably used as the indicator for determining the score, and the minimum $\Delta G^0$ of the contamination reaction is more preferably used as the indicator for determining the score.

As described above, based on the four kinds of scores determined based on four kinds of numerical values calculated by thermodynamics equilibrium calculation of the equilibrium volatilization gas partial pressure of the gas including the target metal, the total sum of the equilibrium substance amounts of the target metal in a solid compound including the target metal, the free energy $\Delta G^0$ of Gibbs of the volatilization reaction involving the target metal, and the free energy $\Delta G^0$ of Gibbs of the contamination reaction involving the target metal, in one embodiment, as the multiplier of the scores, the score of each candidate (which can also be referred to as the comprehensive score) can be calculated (S26 and S27 in FIG. 2). Namely, for example, when the four kinds of scores are A, B, C and D for a given candidate, the score of the candidate can be determined as the score=A×B×C×D. Further, in one embodiment, in the above case, as the total of the four kinds of scores (A+B+C+D), the score of the candidate can be determined. By assigning the scores of respective candidates as a multiplier thereof, it is possible to more emphasize the difference among respective candidates.

Further, also in the embodiment in which assignment of a score is performed by calculation, as with the embodiment in which a score is experimentally assigned, the assignment of a score can be performed based on the value obtained after performing the following procedure: a weighting function is determined based on the metal contamination level of the heat-treated product heat treated in a heat treatment furnace after a test pretreatment or a pretreatment has actually been performed; and the value obtained by calculation with the weighting function is subjected to a weighting treatment. Still alternatively, the assignment of a score may be performed using simulation, optimization calculation tool or the like.

<Determination of Pretreatment Conditions>

As described above, to each of a plurality of candidates of the combination of the type of the supply gas and the heating temperature, a score is assigned according to the type of the target metal identified as an object to be removed. With the thus assigned score as an indicator, the pretreatment conditions to be adopted for actually performing the pretreatment of a heat treatment furnace can be determined. As for the determination criteria, for example, in one embodiment, the pretreatment conditions can be determined from the candidates with a score equal to or more than a prescribed score. Alternatively, in another embodiment, the candidate with the highest score of the plurality of candidates can be determined as the pretreatment conditions. However, the candidate actually determined as the pretreatment conditions is not limited to the candidate with the highest score. For example, the pretreatment conditions can also be determined from the candidates with a score within a prescribed range in consideration of the cost of the supply gas, the easiness of handling and the like.

[Method of Pretreatment of Heat Treatment Furnace]

One aspect of the present invention relates to a method of pretreatment of a heat treatment furnace including: determining the pretreatment conditions of the heat treatment furnace by the above determination method; and pretreating the heat treatment furnace under the determined pretreatment conditions.

Figure 3:
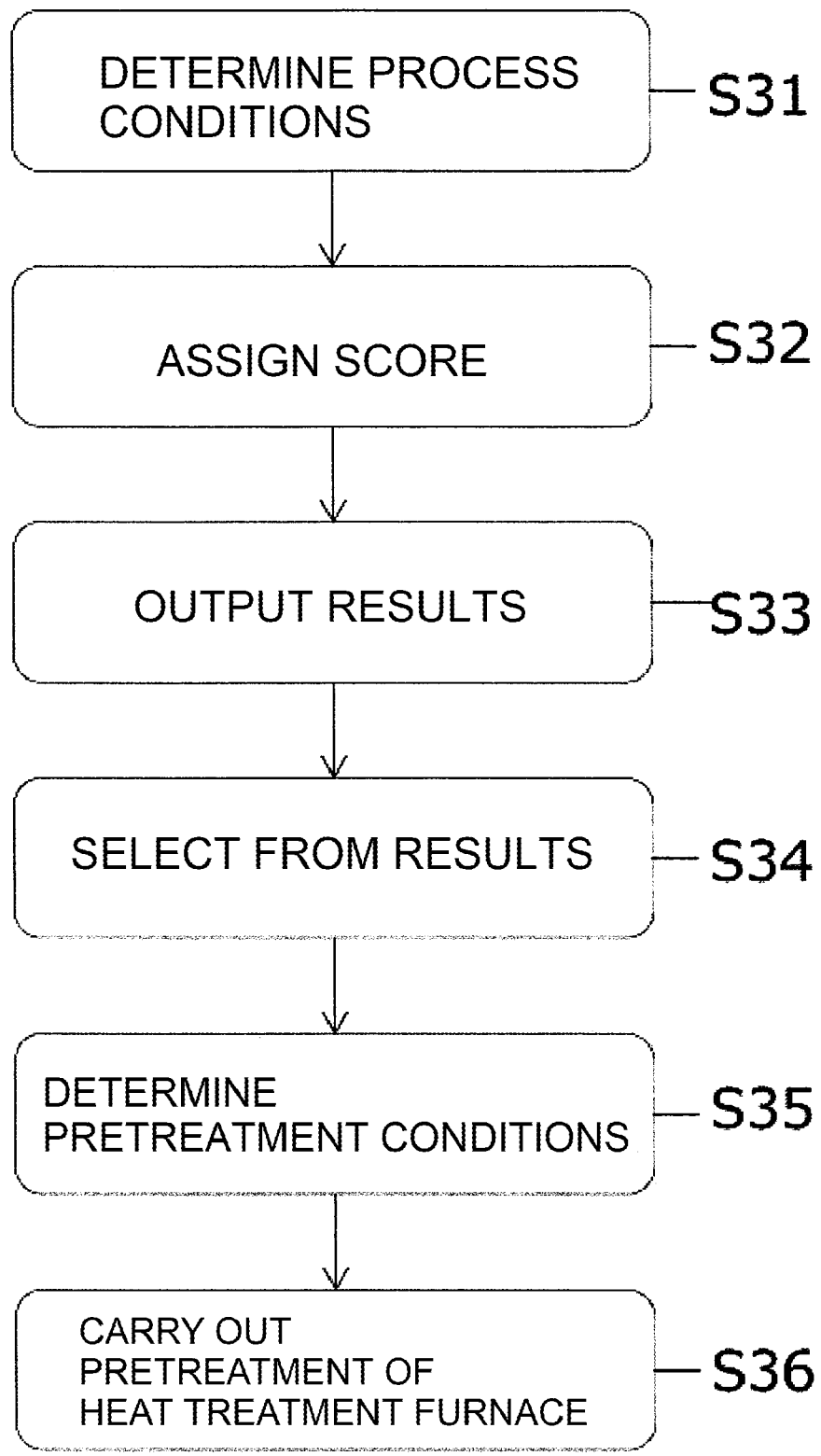
FIG. 3 is a flowchart showing one example of a method of pretreatment in accordance with one aspect of the present invention.

FIG. 3 is a flowchart showing one example of the method of pretreatment in accordance with one aspect of the present invention. Various process conditions such as the target metal, the constituent element of the object to be heated, which is to be actually heat treated in a heat treatment furnace, and the constituent element of the member actually present in a heat treatment furnace during a heat treatment are determined. Then, as described in details previously, the assignment of a score can be performed (S31 and S32 in FIG. 3). The thus assigned score is, for example, outputted from analysis software (S33 in FIG. 3). The combination of the supply gas and the heating temperature can be selected from the outputted results with the score as an indicator, and the pretreatment conditions can be determined (S34 and S35 in FIG. 3). The selection herein can be performed automatically or manually. Then, under the thus determined pretreatment conditions, the heat treatment furnace can be pretreated (S36 in FIG. 3).

With the above pretreatment method, using the supply gas of the type determined by the above determination method, and at the determined heating temperature, the heat treatment furnace is pretreated. The pretreatment is also generally referred to as "empty heating", and, normally, is performed before performing a heat treatment with the object to be heated arranged in the heat treatment furnace. For example, in a ventilatable state in which a gas is supplied from the gas supply port of the heat treatment furnace, and the gas in the furnace is discharged from the gas discharge port of the heat treatment furnace, the gas of the type determined as the pretreatment conditions is supplied into the heat treatment furnace heated to the heating temperature determined as the pretreatment conditions, thereby performing the pretreatment. As a result, at least a part or the whole of the pollutant metal polluting the interior of the heat treatment furnace can be discharged to the outside of the heat treatment furnace. Preferably, a part or the whole of the target metal identified as the object to be removed can be discharged to the outside of the heat treatment furnace. After performing such a pretreatment, the heat treatment of the object to be heated is performed. As a result, the object to be heated can be suppressed from being metal polluted by the heat treatment. The pretreatment time can be determined according to the type of the metal to be removed, the metal contamination level and the like. For example, the pretreatment time can be set at about 1 minute to 20 hours. However, this range is an example and does not limit the present invention.

[Method of Manufacturing Semiconductor Wafer]

One aspect of the present invention relates to a method of manufacturing a heat-treated semiconductor wafer, including pretreating a heat treatment furnace by the above pretreatment method; and heat treating a semiconductor wafer in the pretreated heat treatment furnace.

Examples of the semiconductor wafer to be subjected to a heat treatment can include various semiconductor wafers such as a silicon wafer and the like. For example, a heat treatment can be performed in the following manner: a silicon single crystal wafer cut out from a silicon single crystal ingot grown by a known method is arbitrarily subjected to one or more of polishing processing such as mirror polishing, processing such as chamfering processing, and then, is introduced to a heat treatment furnace. Specific examples of the heat treatment can include various heat treatments such as annealing, gas phase growth, thermal oxidation and the like. The heat treatments can be carried out by a known method. By heat treating a semiconductor wafer in a heat treatment furnace after having been pretreated with the above pretreatment method, it becomes possible to provide a heat-treated semiconductor wafer suppressed in metal contamination from the heat treated furnace. Examples of such a heat treated semiconductor wafer can include various silicon wafers such as an annealed wafer obtained by forming a modified layer on a silicon single crystal wafer by an annealing treatment, an epitaxial wafer having an epitaxial layer on a silicon single crystal wafer, a silicon single crystal wafer having a thermal oxide film and the like.

[Heat Treatment Device]

One aspect of the present invention relates to a heat treatment device including a heat treatment furnace, a heat treatment furnace control part, and a pretreatment conditions determination part which determines pretreatment conditions of pretreating the heat treatment furnace. The pretreatment is heating the interior of the furnace of the heat treatment furnace while supplying a gas therein. The pretreatment conditions determination part includes a candidate recording part which records a plurality of candidates of the combination of the type of the supply gas and the heating temperature, and an analysis part having a calculating information recording part, a score calculation part and a combination determination part. The calculating information recording part records calculating information for calculating the score of the candidate recorded in the candidate recording part. The calculating information is determined according to the type of the target metal identified as the object to be removed by the pretreatment. The score calculation part calculates the score of the candidate recorded in the candidate recording part from the calculating information. The combination determination part determines the combination of the type of the supply gas and the heating temperature to be adopted as the pretreatment conditions of the heat treatment furnace from the plurality of candidates, with the calculated score serving as an indicator. The heat treatment furnace control part receives, from the combination determination part, the information of the combination of the type of the supply gas and the heating temperature determined in the combination determination part, and transmits the pretreatment execution information for causing the heat treatment furnace to execute the pretreatment according to the received information. The heat treatment furnace receives the pretreatment execution information and executes the pretreatment according to the pretreatment execution information.

With the above heat treatment device, it is possible to perform the determination of the pretreatment conditions by the above determination method and the pretreatment of the heat treatment furnace under the determined pretreatment conditions. The details of determination of such pretreatment conditions and execution of the pretreatment are as described previously.

Below, one example of the above heat treatment device will be described with reference to the drawings. However, the above heat treatment device is not limited to the embodiments shown in the drawings. Below, in each drawing, the same part is given the same reference numeral and sign.

Figure 4:
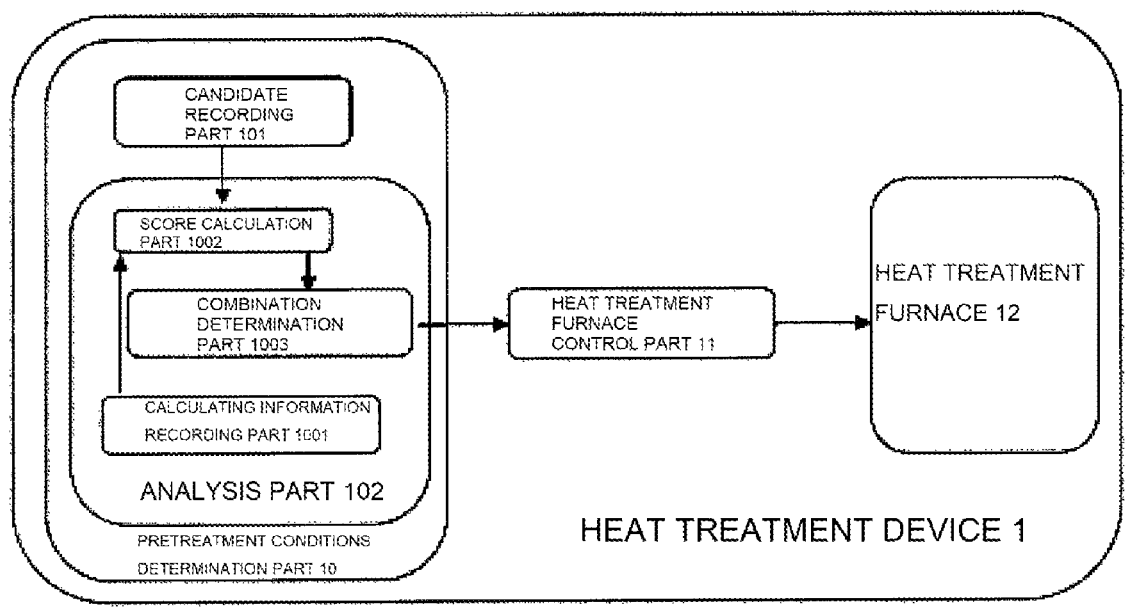
FIG. 4 is a schematic view showing a configuration of one example of a heat treatment device in accordance with one aspect of the present invention.

FIG. 4 is a schematic view showing a configuration of one example of the heat treatment device. A heat treatment device 1 shown in FIG. 4 has a pretreatment conditions determination part 10, a heat treatment furnace control part 11, and a heat treatment furnace 12.

The pretreatment conditions determination part 10 has a candidate recording part 101 and an analysis part 102.

To the candidate recording part 101, a plurality of candidates of the combination of "the type of the supply gas" and "the heating temperature" for the pretreatment of the heat treatment furnace 12 are inputted and recorded. Further, to the candidate recording part 101, the type of the target metal identified as the object to be removed by the pretreatment can also be inputted and recorded.

To a calculating information recording part 1001, the information to be used for calculating the score of each candidate in a score calculation part 1002 is inputted and recorded. The calculating information is determined according to the type of the target metal identified as the object to be removed by the pretreatment. The details of determination are as described previously.

For example, in the embodiment in which the assignment of a score is experimentally performed, the information compiled in a data base format as described previously (e.g., a score table showing respective scores for a plurality of candidates of the combination of the type of gas and the heating temperature for every target metal) can be recorded in the calculating information recording part 1001.

In the embodiment in which the assignment of a score is performed by calculation, for example, the calculating information to be recorded in the calculating information recording part 1001 can be determined by thermodynamics equilibrium calculation based on the type of the target metal identified as the object to be removed by the pretreatment. The details of the calculation are as described previously.

In the score calculation part 1002, the score of each candidate recorded in the candidate recording part 101 is calculated from the calculating information recorded in the calculating information recording part 1001. For example, the candidate information recorded in the candidate recording part 101 is copied to software for performing score calculation, or is subjected to other processing, thereby to be extracted, and the calculating information recorded in the calculating information recording part 1001 is copied to the same software, or is subjected to other processing, thereby to be extracted. Thus, the score of each candidate is calculated by a prescribed calculation method. The details of calculation are as described previously. As one example, the calculating information can include the following information determined by thermodynamics equilibrium calculation: the equilibrium volatilization gas partial pressure of the gas including the target metal identified as the object to be removed, the total sum of the equilibrium substance amounts of the target metal in a solid compound including the target metal, the free energy $\Delta G^0$ of Gibbs of the volatilization reaction involving the target metal and the free energy $\Delta G^0$ of Gibbs of the contamination reaction involving the target metal. Then, the score of each candidate can be the multiplier of the score determined, with the equilibrium volatilization gas partial pressure of the gas, which includes the target metal, as an indicator, the score determined with the total sum of the equilibrium substance amounts of the target metal in a solid compound, which includes the target metal, as an indicator, the score determined with the free energy $\Delta G^0$ of Gibbs of the volatilization reaction involving the target metal as an indicator, and the score determined with the free energy $\Delta G^0$ of Gibbs of the contamination reaction involving the target metal as an indicator.

The combination determination part 1003 determines the combination of the type of the supply gas and the heating temperature to be adopted as the pretreatment conditions of the heat treatment furnace 12 from a plurality of candidates of the combination recorded in the candidate recording part 101 with the score of each candidate determined in the score calculation part 1002 as an indicator. The details of the determination are as described previously.

Figure 5:
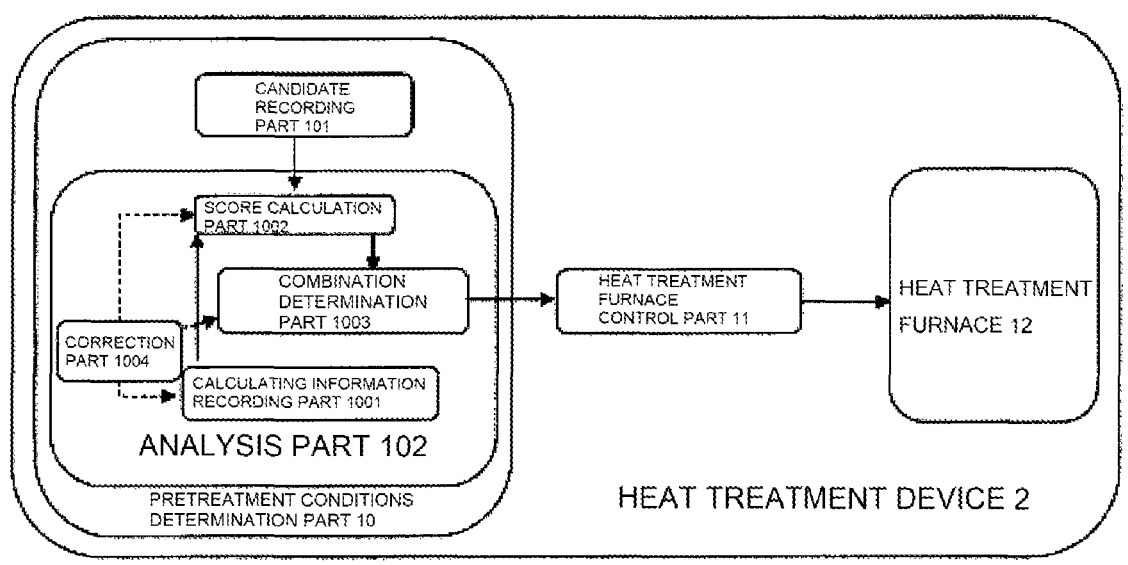
FIG. 5 is a schematic view showing a configuration of another example of the heat treatment device in accordance with one aspect of the present invention.

The heat treatment device 2 shown in FIG. 5 has the same configuration as that of the heat treatment device 1 shown in FIG. 4 except for including a correction part 1004 in the analysis part 102. The correction part 1004 can provide correction information to one or more selected from the group consisting of the calculating information recording part 1001, the score calculation part 1002 and the combination determination part 1003. In one embodiment, the correction information can be the correction information for correcting the determination method for determining the calculating information in the calculating information recording part 1001 based on the metal contamination level of the heat-treated product, which has been heat treated in the heat treatment furnace actually subjected to the pretreatment. The metal contamination level can be determined by a known method such as a method for quantifying the metal component recovered from the heat-treated product by ICP-MS or the like, or a method for analyzing the heat-treated product by a μ-PCD method, a SPV method or the like. Alternatively, in another embodiment, the correction information can be the information for correcting the calculation expression for calculating the score in the score calculation part 1002 based on the metal contamination level of the heat-treated product, which has been heat treated in the heat treatment furnace actually subjected to the pretreatment. Still alternatively, in a still other embodiment, the correction information can be the information for correcting the determination criteria for determining the pretreatment conditions in the combination determination part 1003. The correction information can be provided to only one, can be provided to two, and can be provided to three selected from the group consisting of the calculating information recording part 1001, the score calculation part 1002, and the combination determination part 1003.

Thus, in the combination determination part 1003, with the score calculated in the score calculation part 1002 as an indicator, the combination of the type of the supply gas and the heating temperature to be adopted as the pretreatment conditions of the heat treatment furnace 12 is determined from a plurality of candidates recorded in the candidate recording part 101.

The heat treatment furnace control part 11 receives the information of the combination of the supply gas and the heating temperature thus determined from the combination determination part 1003, and transmits the pretreatment execution information for causing the heat treatment furnace 12 to execute the pretreatment in response to the received information.

The heat treatment furnace 12 receives the pretreatment execution information, and executes the pretreatment in response to the signal. The details of the heat treatment furnace 12 are as described previously regarding the heat treatment furnace for which the pretreatment conditions are determined.

In one embodiment, after the pretreatment is thus carried out, the heat treatment for obtaining the previously described correction information and the analysis of the metal contamination level of the heat-treated product can be performed. Thus, the correction information can be formed based on the analysis results, and can be inputted to the correction part 1004.

Figure 6:
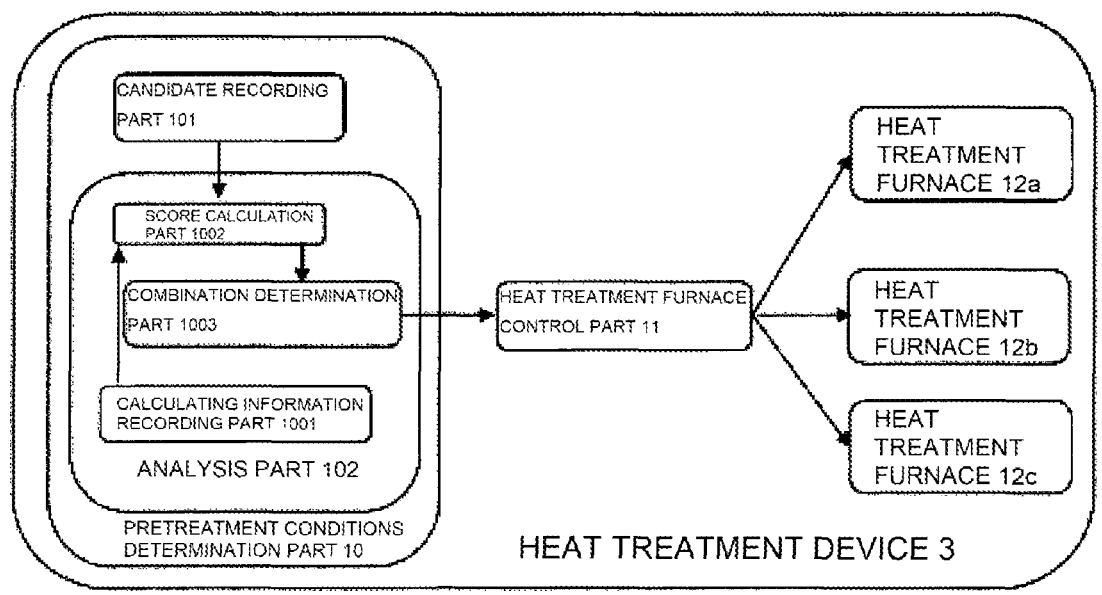
FIG. 6 is a schematic view showing a configuration of a still other example of the heat treatment device in accordance with one aspect of the present invention.

The heat treatment device 3 shown in FIG. 6 has the same configuration as that of the heat treatment furnace 12 shown in FIG. 4 except that the pretreatment signal from the heat treatment furnace control part 11 is received by a plurality of heat treatment furnaces (12a, 12b, and 12c). FIG. 6 shows the three heat treatment furnaces as an example. However, the number of the heat treatment furnaces for receiving the pretreatment execution information from one heat treatment furnace control part has no particular restriction.

Figure 7:
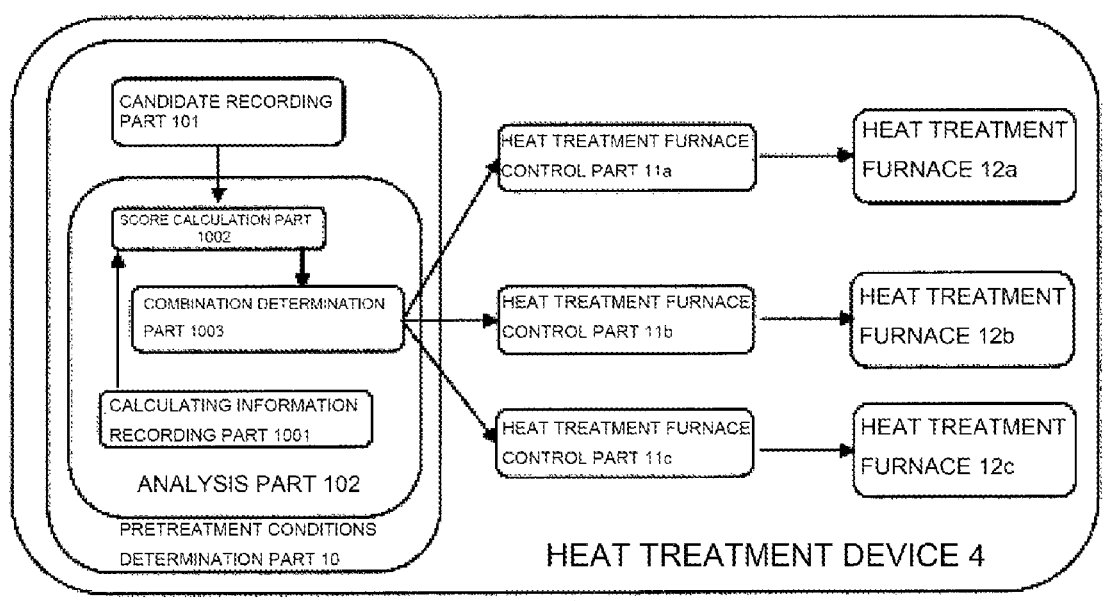
FIG. 7 is a schematic view showing a configuration of a furthermore example of the heat treatment device in accordance with one aspect of the present invention.

The heat treatment device 4 shown in FIG. 7 has the same configuration as that of the heat treatment furnace 12 shown in FIG. 4, except that the information determined in the combination determination part 1003 is received by a plurality of heat treatment furnace control parts (11a, 11b, and 11c). FIG. 7 shows three heat treatment furnace control parts as an example. However, the number of the heat treatment furnace control parts for receiving the information from one combination determination part has no particular restriction. Further, the same information can be sent from one combination determination part to a plurality of heat treatment furnace control parts, or different information items can be sent to a plurality of heat treatment furnace control parts for pretreating a plurality of heat treatment furnaces under different pretreatment conditions.

Alternatively, the heat treatment device shown in FIG. 7 can be modified so that the pretreatment signal from one heat treatment furnace control part can be received by a plurality of heat treatment furnaces.

The pretreatment conditions determination part 10 and the heat treatment furnace control part 11 can include one or two or more computers, and various operations of each part can be executed by software installed on a computer. Further, transmitting and receiving of various information items can be carried out by wire communication or wireless communication.

[Manufacturing Device of Semiconductor Wafer]

One aspect of the present invention relates to a heat-treated semiconductor wafer manufacturing device including the above heat treatment device.

The above manufacturing device includes at least the above heat treatment device, and can arbitrarily include one or more devices for subjecting a semiconductor wafer to various treatments. Examples of such a device can include a polishing device for subjecting a silicon single crystal wafer cut out from a silicon single crystal ingot to polishing processing such as mirror polishing and the like, a chamfering processing device for performing chamfering processing, and the like.

For other details of the above heat treatment device and the above semiconductor wafer manufacturing method, reference can be made to the previous descriptions regarding the determination method, the pretreatment method and the manufacturing method.

Examples

Below, the present invention will be further described by way of Examples. However, the present invention is not limited to the embodiments shown in Examples. "%" shown below is % by volume.

1. Identification of Target Metal

Iron was identified as the metal to be removed.

2. Determination of Candidate of Pretreatment Conditions

The types of the supply gas of the candidates were set as oxygen (100% $O_2$), nitrogen (100% $N_2$), argon (100% Ar), hydrogen (100% $H_2$), a mixed gas of hydrogen and oxygen (80% $H_2$/20% $O_2$), and a mixed gas of 1,2-dichloroethylene and oxygen (20% Trans-1,2-dichloroethylene/80% $O_2$). The heating temperatures of the candidates were set as 1100° C., 1150° C., 1200° C., 1250° C., and 1300° C. As the pressure in the heat treatment furnace, 1 atm was selected. Thus, thermodynamics equilibrium calculation was carried out in the following manner. The thermodynamics equilibrium calculation was carried out using thermodynamics equilibrium calculation software MALT by the algorithm accompanying the software. In the tables below, a mixed gas of hydrogen and oxygen (80% $H_2$/20% $O_2$) is expressed as "80% $H_2/O_2$", and a mixed gas of Trans-1,2-dichloroethylene and oxygen (20% Trans-1,2-dichloroethylene/80% $O_2$) is expressed as "20% Trans1,2DCE/$O_2$".

Below, a description will be given by taking the calculation results for the heating temperature of 1200° C. as an example.

3. Determination of Score with Equilibrium Volatilization Gas Partial Pressure of Gas Including Target Metal as Indicator The heating temperature (1200° C.) and the pressure (1 atm) were inputted to the thermodynamics equilibrium calculation software, and the target metal element, the element constituting the supply gas of the candidate, silicon (Si), and the substances which can be generated by the constituent elements of the silicon oxide film ($SiO_2$) present on the surface of the member (wafer support member) arranged in the heat treatment furnace during actual heat treatment are selected from the data base of the software, and the substance amount of each substance was inputted. When the information was inputted, the total sum P of the equilibrium volatilization gas partial pressures of the gases including iron was determined from the calculation results of the multicomponent thermodynamics equilibrium calculation by the thermodynamics equilibrium calculation software. With the P herein determined as an indicator, according to the following evaluation criteria table (Table 1), for the candidates of the combinations of the heating temperature of 1200° C. and the supply gas shown in Table 2, the scores with the equilibrium volatilization gas partial pressure of the gas, that includes iron, serving as an indicator were determined as shown in Table 2.

TABLE 1

| Equilibrium volatilization gas partial pressure P (atm) | Score |
|---|---|
| $P < 1 \times 10^{-10}$ | 1 |
| $1 \times 10^{-10} \leq P < 1 \times 10^{-8}$ | 2 |
| $1 \times 10^{-8} \leq P < 1 \times 10^{-5}$ | 3 |
| $1 \times 10^{-5} \leq P < 1 \times 10^{-4}$ | 4 |
| $1 \times 10^{-4} \leq P < 1$ | 5 |

TABLE 2

| | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Equilibrium volatilization gas partial pressure (atm) | 3.16E − 12 | 7.83E − 08 | 7.83E − 08 | 7.82E − 08 | 8.75E − 05 | 2.85E − 02 |
| Score (point) | 1 | 3 | 3 | 3 | 4 | 5 |

4. Determination of Score with Total Sum of Equilibrium Substance Amounts of Target Metal in Solid Compound Including Target Metal By the input in 3 above, the thermodynamics equilibrium calculation software calculated the equilibrium substance amount of iron in a solid substance including iron and silicon. From the calculation results, the total sum Mc of the equilibrium substance amounts of iron in the solid substance including iron and silicon. With the Mc herein determined as an indicator, according to the following evaluation criteria table (Table 3), for the candidates of the combination of the heating temperature of 1200° C. and the supply gas shown in Table 4 below, the scores with the total sum of the equilibrium substance amounts of iron in a solid compound including iron as an indicator were determined as shown in Table 4.

TABLE 3

| Total sum $M_c$ (mol) of equilibrium substance amounts of iron in a solid compound including iron and silicon | Score |
|---|---|
| $1 \times 10^{-5} \leq M_c < 1$ | 1 |
| $1 \times 10^{-6} \leq M_c < 1 \times 10^{-5}$ | 2 |
| $1 \times 10^{-8} \leq M_c < 1 \times 10^{-6}$ | 3 |
| $0 < M_c < 1 \times 10^{-8}$ | 4 |
| $M_c = 0$ | 5 |

TABLE 4

| | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Fe3Si | 0 | 0 | 0 | 6.94E − 02 | 0 | 0 |
| FeSiO3 ferrosilite | 0 | 1.24E − 06 | 2.25E − 06 | 0 | 999.3 | 0 |
| Total sum (mol) of substance amounts of iron in compound | 0.00E + 00 | 1.24E − 06 | 2.25E − 06 | 2.08E − 01 | 999.3 | 0 |
| Score (point) | 5 | 2 | 2 | 1 | 1 | 5 |

5. Determination of Score with Free Energy $\Delta G^0$ of Gibbs of Volatilization Reaction Involving Target Metal as Indicator By the input in 3 above, the thermodynamics equilibrium calculation software calculated the free energy $\Delta G^0$ of Gibbs of the volatilization reaction in which the volatile substance including iron in the selected substance volatilizes. The calculation results are shown in Table 5.

TABLE 5

| The formula of chemical reaction | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Fe(s) → Fe(g) | 200.3 | 200.3 | 200.3 | 200.3 | 200.3 | 200.3 |
| Fe(s) + 0.5$O_2$(g) → FeO(g) | 102.4 | 102.4 | 102.4 | 102.4 | 102.4 | 102.4 |
| $Fe_2O_3$(s) → Fe(g) + FeO(g) + $O_2$(g) | 746.2 | 746.2 | 746.2 | 746.2 | 746.2 | 746.2 |
| $Fe_2O_3$(s) → 2Fe(g) + 3/2$O_2$(g) | 844.0 | 844.0 | 844.0 | 844.0 | 844.0 | 844.0 |
| $Fe_2O_3$(s) → 2FeO(g) + 1/2$O_2$(g) | 648.3 | 648.3 | 648.3 | 648.3 | 648.3 | 648.3 |
| Fe(s) + NO(g) → FeO(g) + 1/2$N_2$(g) | — | 30.8 | — | — | — | — |
| $Fe_2O_3$(s) + NO(g) → 2FeO(g) + $NO_2$(g) | — | 702.5 | — | — | — | — |
| Fe(s) + $H_2O$(g) → FeO(g) + $H_2$(g) | — | — | — | 268.5 | 268.5 | 268.5 |
| $Fe_2O_3$(s) + $H_2$(g) → 2FeO(g) + $H_2O$(g) | — | — | — | 482.2 | 482.2 | 482.2 |
| $Fe_2O_3$(s) + $H_2O$(g) → 2FeO(g) + $H_2$(g) + $O_2$(g) | — | — | — | 814.4 | 814.4 | 814.4 |
| Fe(s) + 2HCl(g) → $FeCl_2$(g) + $H_2$(g) | — | — | — | — | — | −3.7 |
| Fe(s) + $Cl_2$(g) → $FeCl_2$(g) | — | — | — | — | — | −210.8 |
| Fe(s) + 3HCl(g) → $FeCl_3$(g) + 3/2$H_2$(g) | — | — | — | — | — | 89.5 |
| Fe(s) + 3/2$Cl_2$(g) → $FeCl_3$(g) | — | — | — | — | — | −221.2 |
| $Fe_2O_3$(s) + 4HCl2 → $FeCl_2$(g) + 2$H_2O$(g) + 1/2$O_2$(g) | — | — | — | — | — | 103.9 |
| $Fe_2O_3$(s) + 6HCl(g) → 2$FeCl_3$(g) + 3$H_2O$(g) | — | — | — | — | — | 124.1 |
| $Fe_2O_3$(s) + 2$Cl_2$(g) → 2$FeCL_2$(g) + 3/2$O_2$(g) | — | — | — | — | — | 21.9 |
| $Fe_2O_3$(s) + 3$Cl_2$(g) → $FeCl_3$(g) + 3/2$O_2$(g) | — | — | — | — | — | −1.1 |
| The minimum value of $\Delta G^0$(kJ/mol) | 102.4 | 30.8 | 102.4 | 102.4 | 102.4 | −221.2 |

With the minimum value of the free energy $\Delta G^0$ of Gibbs of various volatilization reactions for respective supply gases shown in Table 5 as an indicator, according to the following evaluation criteria table (Table 6), scores with the free energy $\Delta G^0$ of Gibbs of the volatilization reaction involving iron were determined as shown in Table 7 for the candidates of the combination of the heating temperature of 1200° C. and the supply gases shown in Table 7 below.

TABLE 6

| Minimum value SGFEv (kJ/mol) of standard Gibbs free energy of volatilization reaction | Score |
|---|---|
| SGFEv ≥ 150 | 1 |
| 100 ≤ SGFEv < 150 | 2 |
| 50 ≤ SGFEv < 100 | 3 |
| 0 ≤ SGFEv < 50 | 4 |
| SGFEv < 0 | 5 |

TABLE 7

| | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Minimum value (kJ/mol) of $\Delta G^0$ of volatilization reaction | 102.4 | 30.8 | 102.4 | 102.4 | 102.4 | −221.2 |
| Score (point) | 2 | 4 | 2 | 2 | 2 | 5 |

6. Determination of Score with Free Energy $\Delta G^0$ of Gibbs of Contamination Reaction Involving Target Metal as Indicator By the input in 3 above, the thermodynamics equilibrium calculation software calculated the free energy $\Delta G^0$ of Gibbs of the contamination reaction involving the substance including iron among the selected substances. The calculation results are shown in Table 8.

TABLE 8

| The formula of chemical reaction | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Fe(g) + 3/2SiO$_2$(s) → FeSiO$_3$(s) + 1/2Si(g) | | 59.0 | 59.0 | 59.0 | — | — |
| FeO(g) + SiO$_2$(s) → FeSiO$_3$(s) | −284.4 | | | | — | — |
| Fe(g) +1/2O$_2$(g) + SiO$_2$(s) → FeSiO$_3$(s) | | −382.3 | −382.3 | −382.3 | — | — |
| Fe(g) + 2SiO$_2$(s) → FeSiO$_3$(s) + SiO(g) | | 43.0 | 43.0 | 43.0 | — | — |
| Fe(g) + NO(g) + SiO$_2$(s) → FeSiO$_3$(s) + 1/2N$_2$(g) | — | −453.9 | — | — | — | — |
| Fe(g) + H$_2$(g) + SiO$_2$(s) → FeSi(s) + H$_2$O(g) + 1/2O$_2$(g) | — | — | — | 214.7 | — | — |
| 3Fe(g) + H$_2$(g) + SiO$_2$(s) → Fe$_3$Si(s) + H$_2$O(g) + 1/2O$_2$(g) | — | — | — | −218.1 | — | — |
| Fe(g) + SiO$_2$(s) → FeSi(s) + O$_2$(g) | | 380.8 | 380.8 | 380.8 | — | — |
| 3Fe(g) + SiO$_2$(s) → Fe$_3$Si(s) + O$_2$(g) | | −52.1 | −52.1 | −52.1 | — | — |
| Fe(g) + H$_2$O(g) + SiO$_2$(s) → FeSi(s) + H$_2$(g) + 3/2O$_2$(g) | — | — | — | 546.9 | — | — |
| 3Fe(g) + H$_2$O(g) + SiO$_2$(s) → Fe$_3$Si(s) + H$_2$(g) + 3/2O$_2$(g) | — | — | — | 114.0 | — | — |
| Fe(g) + H$_2$O(g) + SiO$_2$(s) → FeSiO$_3$(s) + H$_2$(g) | — | — | — | −216.2 | — | — |
| Fe(OH)$_2$(g) + SiO$_2$(s) → FeSiO$_3$(s) + H$_2$O(g) | — | — | — | — | −102.4 | — |
| FeCl$_2$(g) + 1/2O$_2$(g) + SiO$_2$(s) → FeSiO$_3$(s) + Cl$_2$(g) | — | — | — | — | — | 28.7 |
| FeCl$_2$(g) + 3/2SiO$_2$(s) → FeSiO$_3$(s) + 1/2SiCl$_4$(g) | — | — | — | — | — | 121.2 |
| FeCl$_3$(g) + 1/2O$_2$(g) + SiO$_2$(s) → FeSiO$_3$(s) + 3/2Cl$_2$(g) | — | — | — | — | — | 39.2 |
| FeCl$_3$(g) + 3/2SiO$_2$(s) → FeSiO$_3$(S) + 1/2SiCl$_4$(g) + 1/2Cl$_2$(g) | — | — | — | — | — | 131.6 |
| The minimum value of $\Delta G^0$ (kJ/mol) | −284.4 | −453.9 | −382.3 | −382.3 | −102.4 | 28.7 |

With the minimum value of the free energy $\Delta G^0$ of Gibbs of various contamination reactions for respective supply gases shown in Table 8 as an indicator, according to the following evaluation criteria table (Table 9), the scores with the free energy $\Delta G^0$ of Gibbs of the contamination reaction involving iron as an indicator were determined as shown in Table 10 for the candidates of the combinations of the heating temperature of 1200° C. and the supply gases shown in Table 10 below.

TABLE 9

| Minimum value SGFEc (kJ/mol) of standard Gibbs free energy of contamination reaction | Score |
|---|---|
| SGFEc < −300 | 1 |
| −300 < SGFEc ≤ −200 | 2 |
| −200 < SGFEc ≤ −100 | 3 |
| −100 < SGFEc ≤ 0 | 4 |
| 0 < SGFEc | 5 |

TABLE 10

| | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| Minimum value (kJ/mol) of $\Delta G^0$ of contamination reaction | −284.4 | −453.9 | −382.3 | −382.3 | −102.4 | 28.7 |
| Score (point) | 2 | 1 | 1 | 1 | 3 | 5 |

7. Formation of Score Table

To each candidate of the combination of the heating temperature of 1200° C. and each supply gas, the multiplier of the four kinds of scores determined in 3 to 6 above was assigned as the score of each candidate.

Also for the heating temperatures 1100° C., 1150° C., 1250° C., and 1300° C., as with 3 to 6 above, multicomponent thermodynamics equilibrium calculation was performed, and the scores were determined based on the calculation results in the same manner as with 3 to 6 above. The multiplier of the four kinds of scores thus determined was assigned as the score of each candidate.

The score table of the scores assigned to respective candidates as described above is Table 11 below.

TABLE 11

| | 100% $O_2$ | 100% $N_2$ | 100% Ar | 100% $H_2$ | 80% $H_2/O_2$ | 20% Trans 1, 2 DCE/$O_2$ |
|---|---|---|---|---|---|---|
| 1100° C. | 10 | 32 | 17 | 4 | 24 | 625 |
| 1150° C. | 20 | 36 | 18 | 6 | 24 | 625 |
| 1200° C. | 20 | 24 | 12 | 6 | 24 | 625 |
| 1250° C. | 30 | 94 | 18 | 9 | 45 | 625 |
| 1300° C. | 30 | 17 | 9 | 9 | 60 | 625 |

8. Determination of Pretreatment Conditions and Execution of Pretreatment

Three silicon wafers taken out from the same lot were annealed before the pretreatment or after the following pretreatment. The three silicon wafers are the silicon wafers of the same lot, and hence, can be regarded as being equal in iron contamination level before the heat treatment.

First, from the score table shown in Table 11, the combination of "heating temperature of 1300° C./mixed gas of Trans-1,2-dichloroethylene and oxygen (20% Trans-1,2-dichloroethylene/80% $O_2$)" with a high score was determined as the pretreatment conditions, and the pretreatment (empty heating) of the semiconductor wafer annealing furnace intentionally polluted with iron in a known amount was carried out. The pretreatment was performed for a pretreatment time of 1 hour while supplying the mixed gas into the annealing furnace at a heating temperature (the set temperature of the heating means) of 1300° C. and a pressure in the furnace of 1 atm, and discharging the gas in the furnace from the discharge port of the annealing furnace.

In the annealing furnace after the pretreatment, the silicon wafers were annealed. Also in the annealing furnace before the pretreatment, the silicon wafers were annealed under the same annealing conditions.

The surfaces of the silicon wafer annealed in the annealing furnace before the pretreatment and the silicon wafer annealed in the annealing furnace after the pretreatment were scanned by the same kind of recovery solution (acid solution), and the quantitative analysis of iron in the recovery solution after scanning was performed by an ICP-MS (inductively coupled plasma mass spectrometer). The value obtained by dividing the quantitative value thus obtained by the area of the silicon wafer surface scanned with the recovery solution was referred to as the surface iron concentration of the silicon wafer. It can be said that the lower the thus determined surface iron concentration is, the more the iron contamination of the silicon wafer from the annealing furnace is suppressed. It can also be said that the iron contamination of the annealing furnace in which annealing was carried out is less. The surface iron concentration of the silicon wafer annealed in the annealing furnace before the pretreatment was $5.0\times10^{10}$ atoms/$cm^2$. In contrast, the surface iron concentration of the silicon wafer annealed in the annealing furnace after the pretreatment was $3.0\times10^9$ atoms/$cm^2$. The results have proven that the pretreatment under the pretreatment conditions determined as described above could reduce the iron contamination of the annealing furnace.

Further, as the pretreatment under different conditions from the pretreatment conditions determined above, the pretreatment (empty heating) of the semiconductor wafer annealing furnace intentionally polluted with iron in the same known amount as described above was carried out in the same manner as described above with the heating temperature (the set temperature of the heating means) set at 1300° C., and the supply gas set as argon (100% Ar), and the silicon wafer was annealed in the annealing furnace after the pretreatment under the same annealing conditions. The surface iron concentration of the silicon wafer after annealing was determined in the same manner as described above, and was found to be $2.0\times10^{10}$ atoms/$cm^2$, indicating that the pretreatment could reduce the iron contamination of the annealing furnace.

Further, the above results also has indicated that the pretreatment conditions with a higher score in Table 11 assigned based on the calculation results by thermodynamics equilibrium calculation can more reduce the iron contamination of the heat treatment furnace.

One aspect of the present invention is useful in the technical field in which various heat treatments are performed including the technical field of a semiconductor wafer.

What is claimed is:

1. A method of determination of pretreatment conditions of a heat treatment furnace,
    wherein the pretreatment is heating a furnace interior of the heat treatment furnace while supplying a gas thereinto,
    the method comprising:
    setting a plurality of candidates of a combination of a type of a supply gas and a heating temperature;

calculating, for each candidate of the combination, a score determined according to a type of a target metal identified as an object to be removed in the pretreatment;
determining, from the plurality of candidates, the combination of the type of the supply gas and the heating temperature to be adopted as the pretreatment conditions with the calculated score serving as an indicator;
pretreating the heat treatment furnace under the determined pretreatment conditions; and
manufacturing a heat-treated semiconductor wafer by heat treating a semiconductor wafer in the pretreated heat treatment furnace;
wherein the determined pretreated conditions comprises a multi-component thermodynamics equilibrium calculation according to the type of the target metal and includes calculating, based on the target metal, an equilibrium volatilization gas partial pressure, a total sum of equilibrium substance amounts, a free energy $\Delta G^0$ of Gibbs of a volatilization reaction, and a free energy $\Delta G^0$ of Gibbs of a contamination reaction.

2. The method of determination of pretreatment conditions of the heat treatment furnace according to claim 1, wherein the score is a score determined by the multi-component thermodynamics equilibrium calculation based on the type of the target metal.

3. The method of determination of pretreatment conditions of the heat treatment furnace according to claim 2,
wherein the multicomponent thermodynamics equilibrium calculation comprises an element of the target metal and an element included in the supply gas of the candidate.

4. The method of determination of pretreatment conditions of the heat treatment furnace according to claim 3,
wherein the total sum of the equilibrium substance amounts comprises amounts of the target metal in a solid compound comprising the target metal, and
determining the score with results thus determined serving as an indicator.

5. The method of determination of pretreatment conditions of the heat treatment furnace according to claim 4, wherein the score is a multiplier of:
a score determined with the equilibrium volatilization gas partial pressure of the gas that comprises the target metal serving as an indicator, a score determined with the total sum of the equilibrium substance amounts of the target metal in the solid compound that comprises the target metal serving as an indicator, a score determined with the free energy $\Delta G^0$ of Gibbs of the volatilization reaction that involves the target metal serving as an indicator, and a score determined with the free energy $\Delta G^0$ of Gibbs of the contamination reaction that involves the target metal serving as an indicator.

6. A heat treatment device, comprising:
a heat treatment furnace;
at least one computer comprising a heat treatment furnace control process; and
the at least one computer configured to implement:
a pretreatment conditions determination process that determines pretreatment conditions of pretreating the heat treatment furnace, wherein the pretreatment is heating a furnace interior of the heat treatment furnace while supplying a gas thereinto,
the pretreatment conditions determination process comprises:
a candidate recording process that records a plurality of candidates of a combination of a type of the supply gas and a heating temperature; and an analysis process that includes calculating information recording, a score calculation process and a combination determination process comprising:
recording the calculating information for calculating a score of the candidate recorded in the candidate recording process,
determining the calculating information by a multi-component thermodynamics equilibrium calculation according to a type of a target metal identified as an object to be removed in the pretreatment, wherein the multi-component thermodynamics equilibrium calculation includes calculating, based on the target metal, an equilibrium volatilization gas partial pressure, a total sum of equilibrium substance amounts, a free energy $\Delta G^0$ of Gibbs of a volatilization reaction, and a free energy $\Delta G^0$ of Gibbs of a contamination reaction,
calculating the score of the candidate recorded in the candidate recording process from the calculating information,
determining, from the plurality of candidates, a combination of the type of the supply gas and the heating temperature to be adopted as pretreatment conditions of the heat treatment furnace, with the calculated score serving as an indicator;
the heat treatment furnace control process receives information of the combination of the type of the supply gas and the heating temperature determined by the combination determination process, and transmits pretreatment execution information causing the heat treatment furnace to execute pretreatment according to the received information; and
the heat treatment furnace receives the pretreatment execution information and executes pretreatment according to the pretreatment execution information to manufacture a heat-treated semiconductor wafer by heat treating a semiconductor wafer in the pretreated heat treatment furnace.

7. The heat treatment device according to claim 6,
wherein the is multicomponent thermodynamics equilibrium calculation comprises an element of the target metal and an element included in the supply gas of the candidate.

8. The heat treatment device according to claim 7,
wherein the
the total sum of equilibrium substance amounts comprises amounts of the target metal in a solid compound.

9. The heat treatment device according to claim 8,
wherein the score is a multiplier of:
a score determined with the equilibrium volatilization gas partial pressure of the gas, that comprises the target metal, serving as an indicator,
a score determined with the total sum of the equilibrium substance amounts of the target metal in the solid compound, that comprises the target metal, serving as an indicator,
a score determined with the free energy $\Delta G^0$ of Gibbs of the volatilization reaction, that involves the target metal, serving as an indicator, and
a score determined with the free energy $\Delta G^0$ of Gibbs of the contamination reaction, that involves the target metal, serving as an indicator.

10. The heat treatment device according to claim 6,
which further comprises a correction process which provides correction information to one or more of the calculating information recording process, the score calculation process, and the combination determination process.

11. A manufacturing device of a heat-treated semiconductor wafer, comprising the heat treatment device according to claim 6.

\* \* \* \* \*

UNITED STATES PATENT AND TRADEMARK OFFICE
CERTIFICATE OF CORRECTION

| | | |
|---|---|---|
| PATENT NO. | : 12,183,600 B2 | Page 1 of 1 |
| APPLICATION NO. | : 17/418534 | |
| DATED | : December 31, 2024 | |
| INVENTOR(S) | : Y. Kuwano | |

It is certified that error appears in the above-identified patent and that said Letters Patent is hereby corrected as shown below:

In the Claims

Column 24, Lines 44-45 (Claim 8) please change "wherein the the" to -- wherein the --

Signed and Sealed this
First Day of July, 2025

Coke Morgan Stewart
*Acting Director of the United States Patent and Trademark Office*